US005614752A

United States Patent [19]

Takenaka

[11] Patent Number: 5,614,752
[45] Date of Patent: Mar. 25, 1997

[54] SEMICONDUCTOR DEVICE CONTAINING EXTERNAL SURGE PROTECTION COMPONENT

[75] Inventor: Kazuhiro Takenaka, Suwa, Japan

[73] Assignee: Seiko Epson Corporation, Nagano-ken, Japan

[21] Appl. No.: 177,570

[22] Filed: Jan. 4, 1994

[30] Foreign Application Priority Data

Jan. 7, 1993 [JP] Japan .................................. 5-001072
Dec. 21, 1993 [JP] Japan .................................. 5-322720

[51] Int. Cl.⁶ .......................... H01L 29/76; H01L 29/861; H01L 23/62; H01L 31/107
[52] U.S. Cl. ........................ 257/408; 257/104; 257/106; 257/369; 257/409; 257/355; 257/356; 257/357; 257/605
[58] Field of Search ................................. 257/355, 356, 257/357, 361, 362, 104, 105, 106, 603, 605, 369, 408, 409

[56] References Cited

U.S. PATENT DOCUMENTS

| | | | |
|---|---|---|---|
| 3,512,058 | 5/1970 | Khajezadeh et al. | 257/356 |
| 4,119,440 | 10/1978 | Hile | 257/603 |
| 4,270,137 | 5/1981 | Coe | 257/339 |
| 4,760,433 | 7/1988 | Young et al. | 257/357 |
| 5,019,888 | 5/1991 | Scott et al. | 257/360 |
| 5,040,037 | 8/1991 | Yamaguchi et al. | 257/347 |
| 5,060,037 | 10/1991 | Rountree | 257/360 |
| 5,216,272 | 6/1993 | Kubokoya et al. | 257/409 |
| 5,272,097 | 12/1993 | Shiota | 257/355 |
| 5,311,051 | 5/1994 | Tukizi | 257/409 |
| 5,338,960 | 8/1994 | Beasom | 257/408 |

FOREIGN PATENT DOCUMENTS

| | | | |
|---|---|---|---|
| 0157389 | 10/1985 | European Pat. Off. | 257/360 |
| 0161983 | 11/1985 | European Pat. Off. | 257/360 |
| 0305937 | 3/1989 | European Pat. Off. | 257/360 |
| 0470371 | 2/1992 | European Pat. Off. | 257/360 |
| 1166562 | 6/1989 | Japan | 257/356 |
| 1197154 | 7/1970 | United Kingdom | 257/356 |
| 2152284 | 7/1985 | United Kingdom | 257/360 |
| 2186426 | 8/1987 | United Kingdom | 257/360 |
| 2247779 | 3/1992 | United Kingdom | 257/357 |

*Primary Examiner*—Steven H. Loke
*Attorney, Agent, or Firm*—Loeb & Loeb LLP

[57] ABSTRACT

A semiconductor device that includes at least one MOS transistor that is formed on a semiconductor substrate, in which there is a structure for protecting circuit elements such as transistors from excessive static electricity from the outside, such as surge input and static electricity generated during the production process. Transistors and diodes are formed so that contact is made between a high impurity concentration diffusion region that forms the source or drain and a low impurity concentration diffusion region that has a conductivity opposite that of the high impurity concentration diffusion region that forms an LDD structure transistor offset. By making contact between a high impurity concentration diffusion region and a low impurity concentration diffusion region, there is formed a circuit element that reduces the junction breakdown voltage. In addition, by using the offset of the CMOS structure, there is no increase in the number of production process steps.

8 Claims, 15 Drawing Sheets

5,614,752

SEMICONDUCTOR DEVICE CONTAINING EXTERNAL SURGE PROTECTION COMPONENT

BACKGROUND OF THE INVENTION

This invention relates to a semiconductor device that includes at least one MOS transistor that is formed on a semiconductor substrate, and to a structure for protecting circuit elements such as transistors from events such as a surge input of excessive static electricity from the outside and from static electricity that is generated during fabrication.

As protection against external surge inputs such as static electricity, protection circuits were configured combining a variety of resistances, such as diffusion resistance and polysilicon resistance, or combining diodes and transistors between the bonding pads and internal circuitry.

In recent years, miniaturization of transistors has progressed to achieve higher operating speeds and higher component densities. One transistor structure is an LDD structure in which a low concentration diffusion region is formed on the gate end of the drain diffusion layer, or a double diffusion structure in which a low concentration region is formed by using the difference between the diffusion coefficients of arsenic and of phosphorous. These structures are used extensively for transistors with channel lengths of about one micron to achieve protection against hot carriers. In addition, the thickness of the gate film has become thinner with the miniaturization of transistors. For example, in the case of 0.5 micron design rule transistors, the silicon dioxide films used as the gate films have a thickness of 10 nm.

In this manner, as gate insulating film thickness has been progressively reduced along with insulating miniaturization of the circuit elements, the gate breakdown voltage has, of course, decreased. In the case of a 10-nm-gate insulating film in a 0.5 micron design rule transistor, the breakdown voltage is about 10 volts.

In order to configure an integrated circuit, a sufficient amount of protection circuits have to be created in order to protect the internal circuitry from excessive voltage surges having causes such as static electricity from the outside. In addition, it is necessary to have a structure that allows protection from static electricity that is generated by the IC fabrication process.

In the protective circuits of the prior art, diodes or transistors were used. However, the breakdown voltage of the circuit elements that form these protective circuits does not decrease much even if the transistors have been miniaturized. For example, the drain breakdown voltage of a 0.5-micron design rule transistor is about 13 volts, which is higher than that of the gate insulating film. The problem is that the protective circuit does not function as a protective circuit because before it acts, the gate insulating film is permanently destroyed.

SUMMARY OF THE INVENTION

An object of this invention is to resolve the problem described above and offer a protective configuration with a high resistance to external surge inputs.

The semiconductor device of this invention is characterized in that low breakdown voltage circuit elements are formed within the semiconductor device as protection circuits wherein a transistor or diode contains a high concentration diffusion layer and a low concentration diffusion layer. The low concentration diffusion layer is of opposite conductivity type to the high concentration diffusion layer and is formed so that it makes contact with the high concentration diffusion layer.

In addition, in the case of a semiconductor device with a CMOS structure, a low concentration diffusion layer with opposite conductivity is formed within the semiconductor by using a diffusion layer that is of the same conductivity type as the low concentration diffusion layer of the LDD structure transistor and by forming low resistance circuit elements within the semiconductor without an increase in the number of fabrication process steps.

DESCRIPTION OF THE PREFERRED EMBODIMENTS

Below, this invention will be described with reference to the drawings.

Figure 1A:
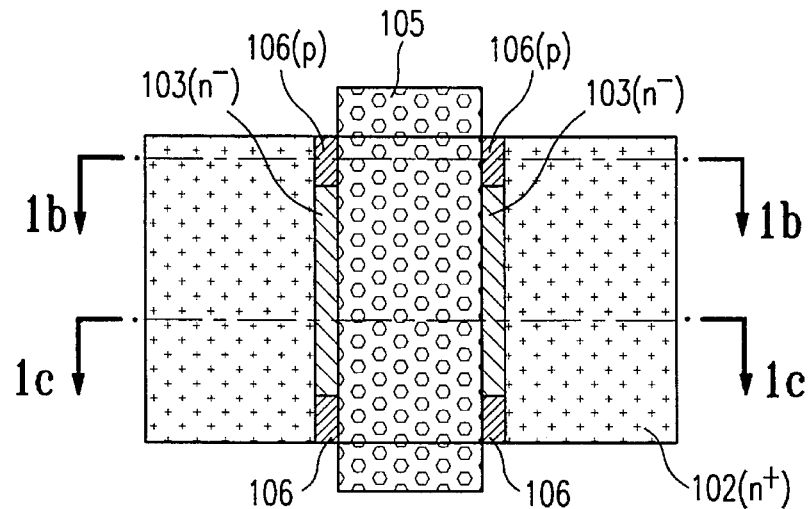
FIGS. 1(a), (b) and (c) show a top view and cross sections of a first embodiment of this invention.
Figure 1B:
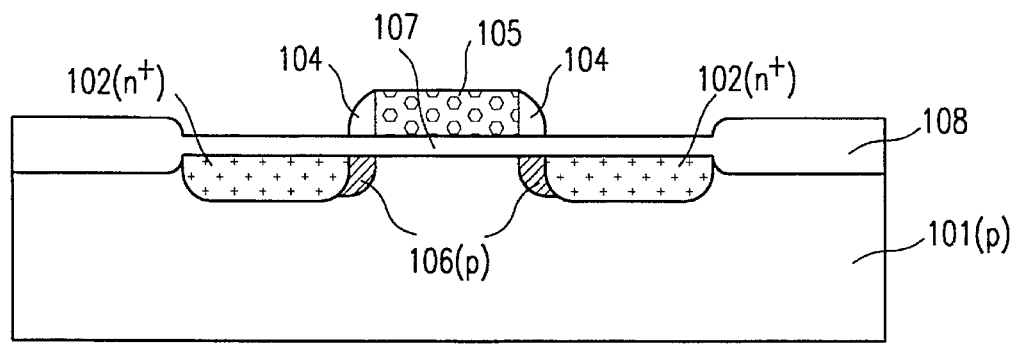
Figure 1C:
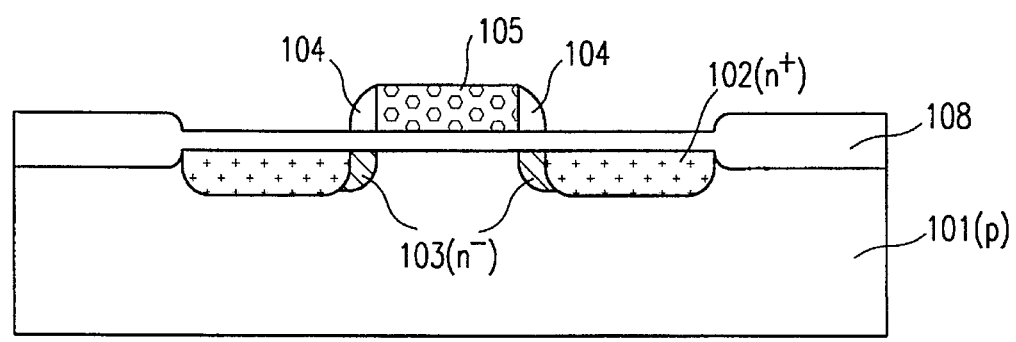

FIG. 1(a) shows a top view of a first embodiment of the semiconductor device of this invention. FIG. 1(b) shows a cross section along line 1b—1b in FIG. 1(a). FIG. 1(c) shows a cross section along line 1c—1c in FIG. 1(a). Here, the case of an n-channel transistor will be described. Number 101 is a p-type Si substrate, having a resistivity of 10-ohm-cm. Because the surface of the substrate has a surface impurity concentration of about $1E16 cm^{-3}$, wells may be formed. Number 107 is a gate insulating film, which is formed of a 10 nm $SiO_2$ film. Number 108 is a device isolating oxide film for isolating circuit elements, which is formed by a method such as the LOCOS method, a technology of the prior art that forms a 500 nm oxide film.

Because films 107 and 108 are formed from the same $SiO_2$ film, they are connected at their edges. A gate electrode 105 is formed by depositing polysilicon or polysilicon and refractory metal silicide, such as WSi, in a layer that is about 300 nm in thickness. N-type low concentration diffusion regions 103 with concentrations of $1E17cm^{-3}$ to $5E19cm^{-3}$, which become offset regions are formed by implanting phosphorous in a dose of from $1E13cm^{-2}$ to $5E14cm^{-2}$ using ion implantation after forming the gate electrode 105. When this phosphorous ion implantation takes place, the n-type regions 103 are formed in the designated regions, by using photoresist to form the designated pattern, as in FIG. 1(a).

Regions 106 are p-type diffusion regions, which is a novel feature of the invention. As for regions 103, after forming a designated pattern using photoresist, p-type regions 106 with a concentration of from $5E16cm^{-3}$ to $5E18cm^{-3}$ are formed by the ion implantation of boron of from $5E12cm^{-2}$ to $5E14cm^{-2}$. Subsequently, the side walls, or side wall spacers, of number 104 are formed by forming an $SiO_2$ film on the entire substrate surface and etching the entire surface. Next, high impurity concentration diffusion regions 102, with a concentration of from $1E20cm^{-3}$ to $1E21cm^{-3}$ are formed by implanting phosphorous with a dose of from $1E15cm^{-2}$ to $1E16cm^{-2}$. Finally, the semiconductor device of this invention is obtained by forming contacts and aluminum interconnects (not illustrated).

The portion indicated by FIG. 1(c) operates as a transistor. Since it has an LDD structure as in the prior art, it is a transistor with little deterioration due to hot carriers. However, when considering the breakdown voltage of this transistor, this is determined by the region in which p-type layer 106 and high concentration n-type layer 102 make contact, as illustrated in FIG. 1(b).

For example, if the impurity concentration of regions 106 were set at $1E18cm^{-3}$, the transistor breakdown voltage would be about 7 volts. Since this is sufficiently below the gate insulating film breakdown voltage of 10 volts, even if static electricity should be present, the transistor is sufficiently protected. Moreover, because the p-type impurity concentration in regions 106 can be controlled freely, e.g. by proper selection of the ion implantation dose, the breakdown voltage value also can be freely controlled. Thus, this invention can be applied even in cases in which the circuit element is further miniaturized, the gate film becomes thinner and the gate film breakdown voltage decreases further.

Figure 2:
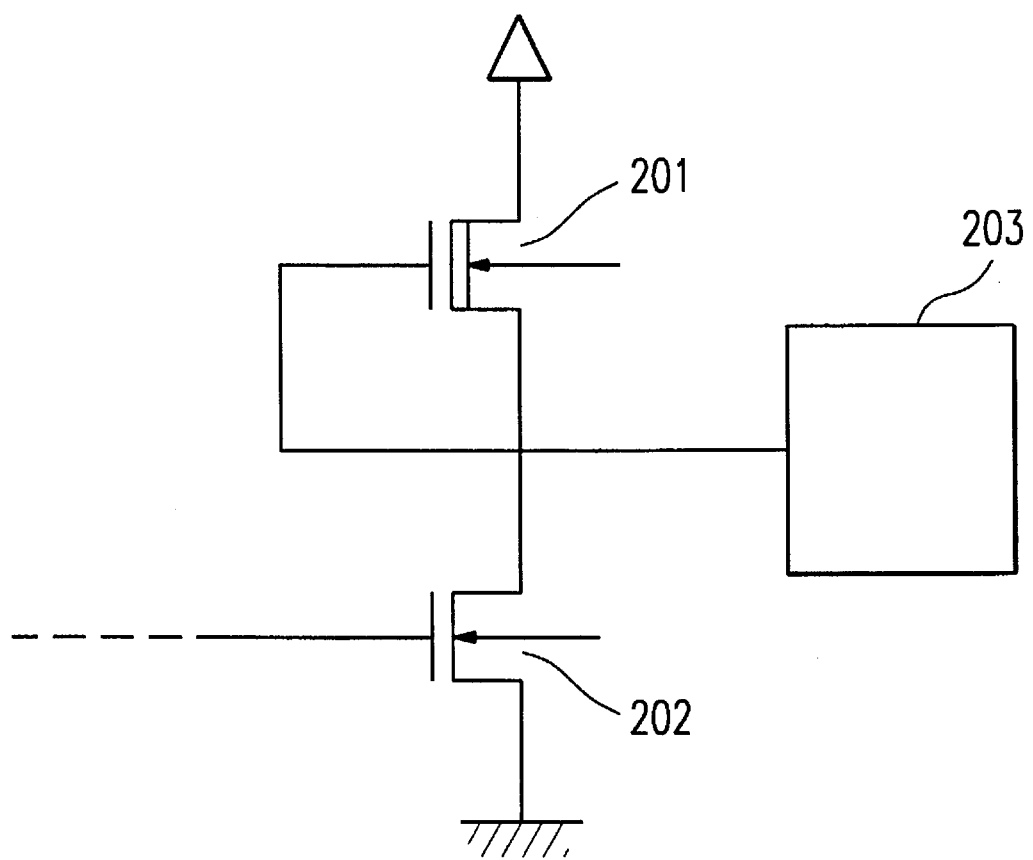
FIG. 2 shows a circuit diagram using the first embodiment of this invention.

FIG. 2 shows an example of a circuit that employs the device of the first embodiment, which circuit includes a bonding pad 203 for external contact with the circuit. The circuit includes a depletion n-channel transistor 201 that is connected as a load and an n-channel transistor 202 constructed according to the invention in which the breakdown voltage that applies has been reduced. With such a circuit, the internal circuitry can be protected from static electricity that enters from the outside. In addition, by using transistors of this invention in internal circuitry, even if static electricity is generated in the middle of the production process, there is the effect that the circuit elements are protected.

Further, while n-channel transistors are described herein, as a matter of course, the invention may be applied to p-channel transistors as well.

Figure 3A:
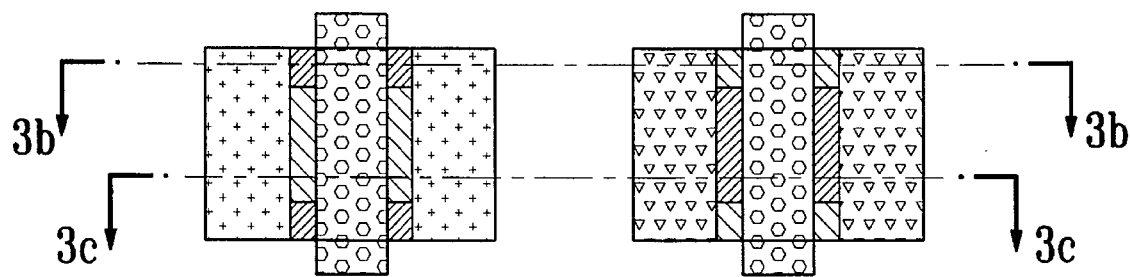
FIGS. 3(a), (b) and (c) show a top view and cross sections of a second embodiment of this invention.
Figure 3B:
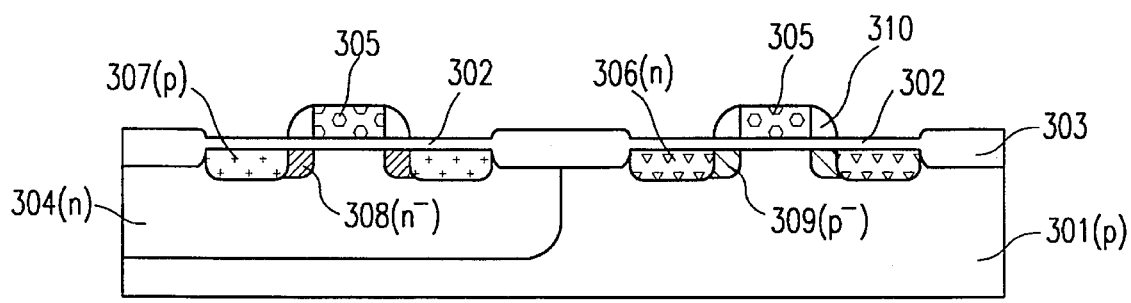
Figure 3C:
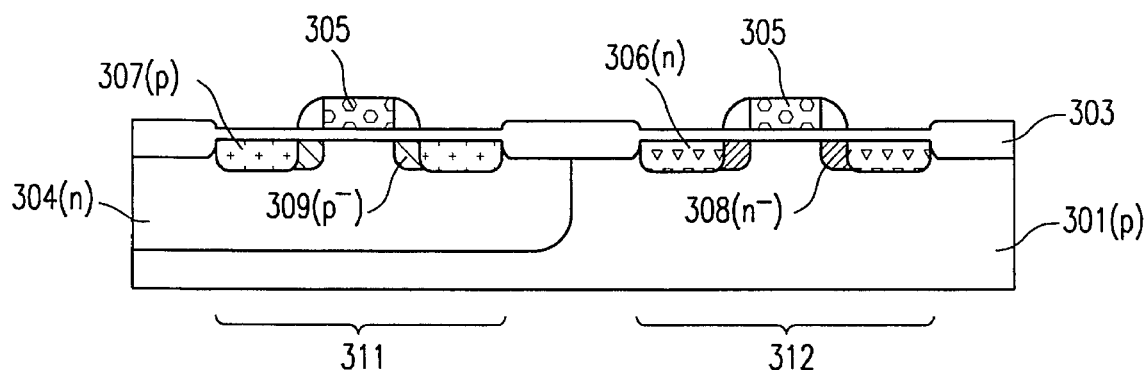

FIGS. 3(a), 3(b) and 3(c) show a second embodiment of the invention. It is an example of applying the first embodiment to a CMOS structure and then reducing the number of production process steps. FIG. 3(a) shows a top view of the second embodiment. FIG. 3(b) shows a cross section along line 3b—3b of FIG. 3(a). FIG. 3(c) shows a cross section along line 3c—3c of FIG. 3(a).

The CMOS structure is formed in a p-type substrate 301 containing an n-well 304. A p-channel transistor 311 is formed in n-well 304 and an n-channel transistor 312 is formed in the p-type substrate. Number 302 is the gate insulating film, which, like the first embodiment, is an $SiO_2$ layer that is 10 nm thick. Number 303 is an oxide layer for isolating the circuit elements. Number 305 is the gate electrode. N-type diffusion regions 306 are the source and drain regions of n-channel transistor 312. Regions 306 are formed with an impurity concentration of from $1E20cm^{-3}$ to $1E21cm^{-3}$.

Regions 307 are p-type impurity diffused regions which will be the source and drain of p-channel transistor 311. Regions 307 are formed to have an impurity concentration of from $1E20cm^{-3}$ to $1E21cm^{-3}$.

Thus, each of transistors 311 and 312 has a channel region, beneath gate electrode 305, which extends in a first direction (horizontally in FIGS. 3(b) and 3(c)), parallel to the substrate surface between source and drain regions 306, 307.

Regions 308 are n-type low impurity concentration diffusion regions formed to have an impurity concentration of from $1E17cm^{-3}$ to $5E19cm^{-3}$.

Regions 309 are p-type low impurity concentration diffusion regions formed to have an impurity concentration of from $1E17cm^{-3}$ to $5E19cm^{-3}$.

As is apparent from FIG. 3(a), at the source and drain of transistor 311, regions 308 are offset from a region 309 in a second direction parallel to the substrate surface and perpendicular to the above-identified first direction. Similarly, at the source and drain of transistor 312, regions 309 are offset from a region 308 in a second direction parallel to the substrate surface and perpendicular to the first direction.

Gate electrodes 305 are provided with side walls 310 which, for example, are formed of an oxide film, just as in the first embodiment.

The n-type low impurity concentration diffusion regions 308 will become the LDD structure offset in the n-channel transistor. The same n-type low impurity concentration diffusion regions will be formed at the offset regions of the p-channel transistor and decrease the breakdown voltage of the p-channel transistor. In the same manner, the p-type low impurity concentration diffusion regions 309 will become the LDD structure offset in the p-channel transistor and the same p-type low impurity concentration diffusion regions will be formed at the offset regions of the n-channel transistor and reduce the breakdown voltage of the n-channel transistor.

The low impurity concentration diffusion layers 308 and 309 are formed by the ion implantation of phosphorous and boron, respectively, after forming the respective patterns using photoresist. Therefore, the formation of low impurity concentration diffusion regions for reducing the breakdown voltage is possible by merely changing the photoresist pattern, making fabrication possible without having to increase the number of production process steps.

In addition, in FIGS. 3(a), 3(b) and 3(c), the example concerns the case in which transistors with an LDD structure are used in both the n-channel and the p-channel. However, if only one channel has the LDD structure, for example, in the case of an n-channel LDD and a p-channel single drain structure, it is possible to reduce the breakdown voltage of the p-channel transistor by forming an n-type low impurity concentration diffusion region on the p-channel transistor.

Figure 4:
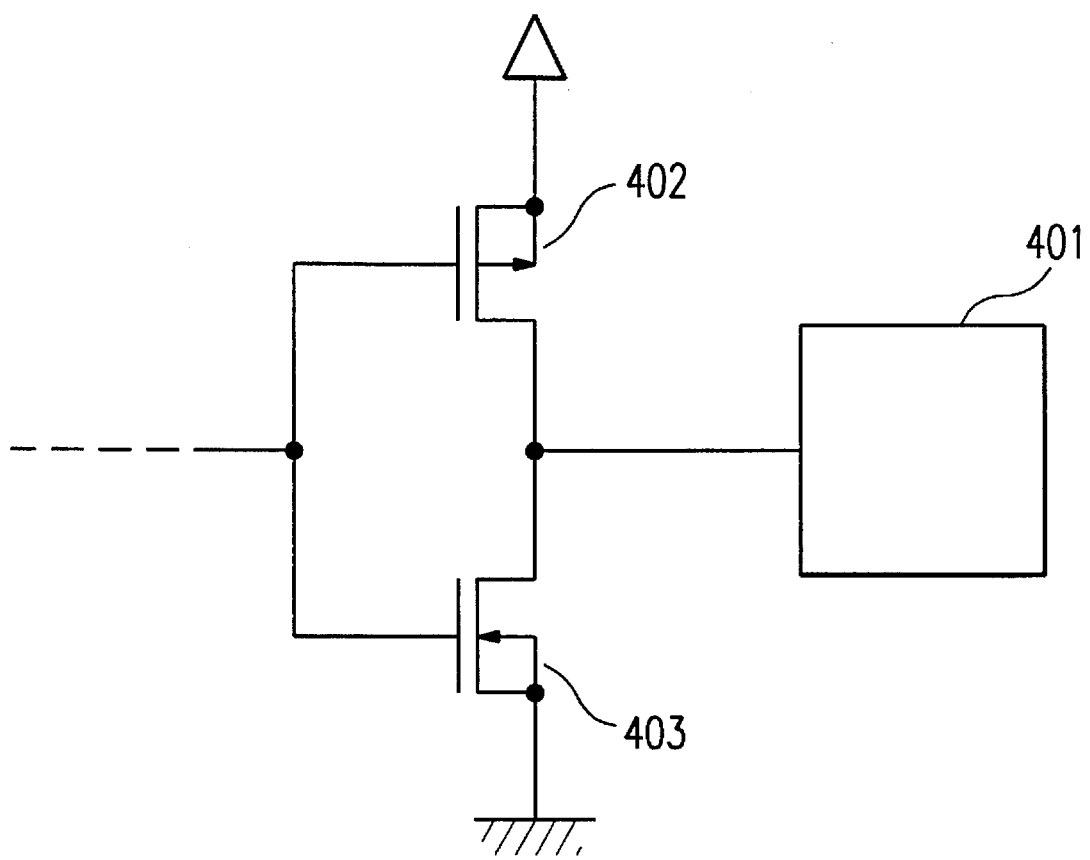
FIG. 4 is a circuit diagram using the second embodiment of this invention.

FIG. 4 shows an example of a circuit that employs the device of the second embodiment, which circuit includes a bonding pad 401 for external contact with the circuit. The circuit includes a p-channel transistor 402 according to the invention and an n-channel transistor 403 according to the invention. For example, when the concentrations of regions 308 and 309 are each set to $1E18cm^{-3}$, the transistor breakdown voltage is about 7 volts. Because this is sufficiently below the gate insulating film breakdown voltage of 10 volts, even if static electricity enters the circuit, the transistor will be adequately protected. In addition, because low breakdown voltage circuit elements have been formed on both the grounding side and the power supply side, it is effective against both positive and negative static electricity.

Figure 5A:
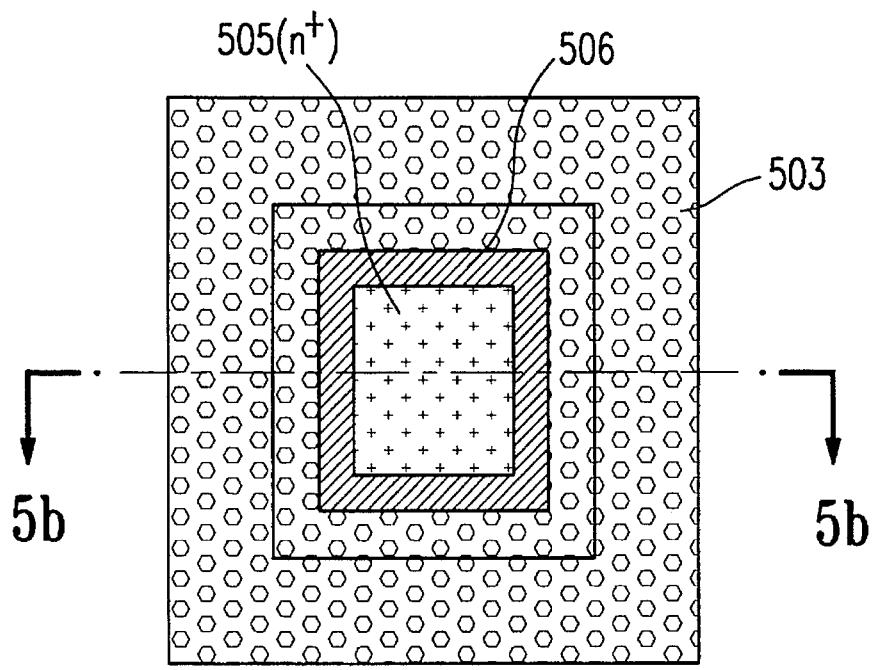
FIGS. 5(a) and (b) show a top view and a cross section of a third embodiment of this invention.
Figure 5B:
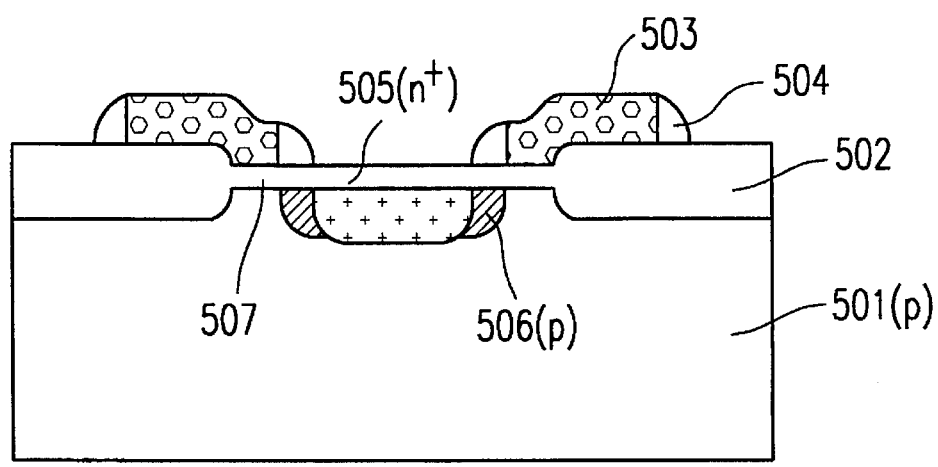

FIG. 5(a) and 5(b) show the third embodiment of this invention. It is an example in which the principle of this invention is applied to a diode. FIG. 5(a) shows a top view, while FIG. 5(b) shows a cross section along line 5b—5b of FIG. 5(a). The case of an n–p diode will be described here. A p-type silicon substrate 501 is, for example, a 10-ohm-cm substrate. Because the surface of substrate 501 has a surface impurity concentration of about $1E16cm^{-3}$, wells may be formed. A gate insulating film 507 is formed as a 10 nm $SiO_2$ film and an oxide film 502 for isolating circuit elements, which is about a 500 nm thick oxide film, is formed, for example, by a LOCOS method, which is known in the art.

Because layers 507 and 502 are formed of the same $SiO_2$ film, they are connected at their ends. A gate electrode 503 is formed of a deposited polysilicon or deposited polysilicon and refractory metal silicide, such as WSi, in a layer that is about 300 nm in thickness. A p-type diffusion region 506 is provided, in accordance with the invention, and is formed to have an impurity concentration of from $5E16cm^{-3}$ to $5E18cm^{-3}$ by boron ion implantation at a dose of from $5E12cm^{-2}$ to $5E14cm^{-2}$.

Subsequently, side walls 504 are formed by forming an $SiO_2$ film and etching the entire surface, as described with respect to previous embodiments. Next, high impurity concentration diffusion region 505, with an impurity concentration of from $1E20cm^{-3}$ to $1E21cm^{-3}$ is formed by implanting phosphorous at a dose of from $1E15cm^{-2}$ to $1E16cm^{-2}$. Finally, the semiconductor device of this invention is obtained by forming contacts and aluminum interconnects (not illustrated).

When considering the breakdown voltage of this diode, the breakdown voltage is determined by the region, or interface, where p-type region 506 and high impurity concentration n-type region 505 make contact.

For example, if the impurity concentration of region 506 were set at $1E18cm^{-3}$, the diode breakdown voltage would be about 7 volts. Since this is sufficiently below the gate insulating film breakdown voltage of 10 volts, even if static electricity should enter the semiconductor device, the transistor is sufficiently protected. Moreover, because the p-type impurity concentration in region 506 can be freely controlled based on the amount of ion implantation, the breakdown voltage value also can be freely controlled. Thus, the present invention can be applied even in cases in which the circuit element is further miniaturized, the gate insulating film becomes thinner and the gate insulating film breakdown voltage decreases further.

Figure 6:
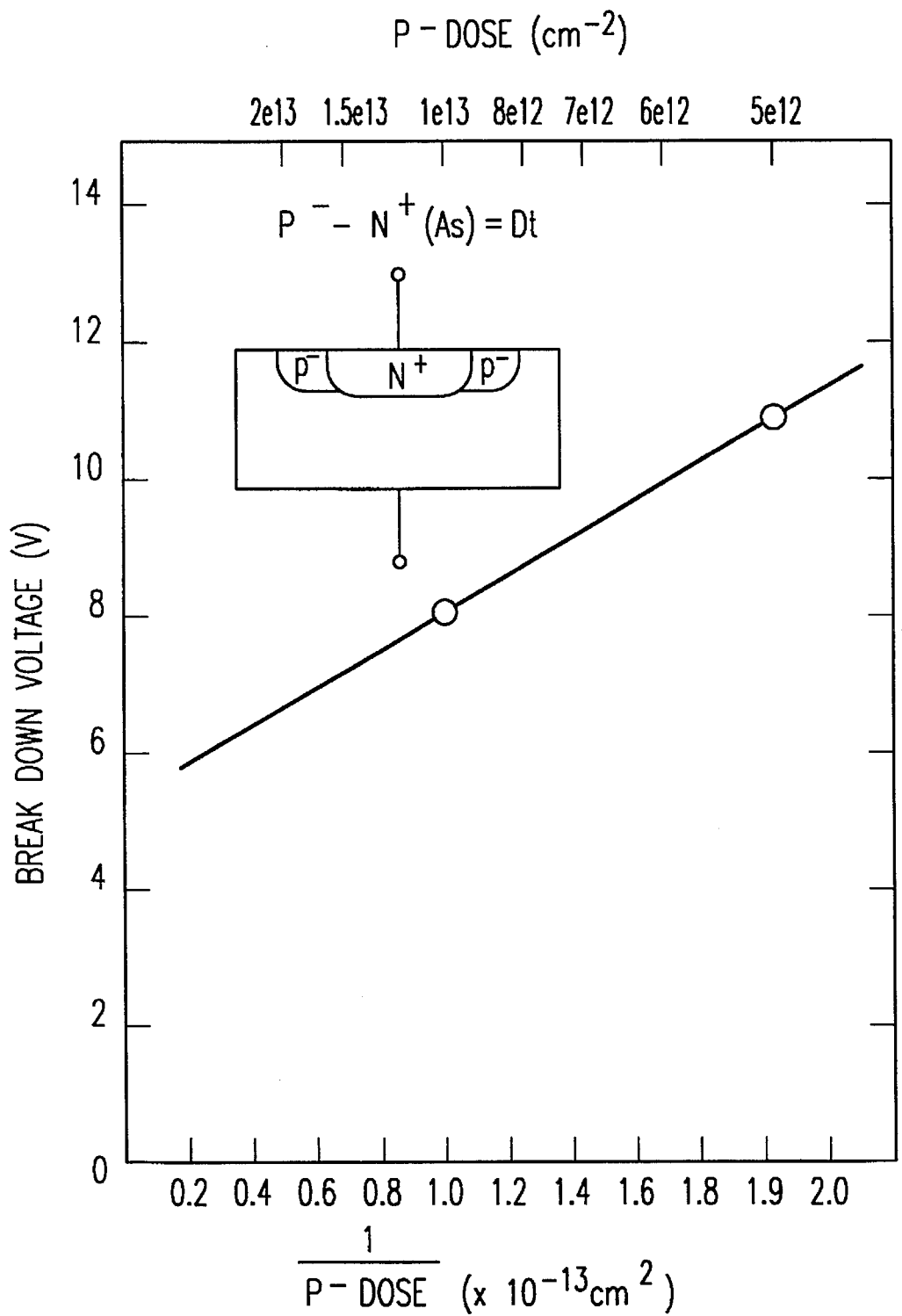
FIGS. 6 and 7 are diagrams showing relations between diode breakdown voltages and low concentration diffusion layer doping level.

FIG. 6 shows the relationship between breakdown voltage of a diode that is comprised of an n-type high concentration diffusion layer and a p-type low concentration diffusion layer and p-dose for forming the p-type low concentration diffusion layer.

The n-type high concentration diffusion layer is formed by implanting As.

As shown in FIG. 6, when p-dose is set at $1E13^{-2}$, the breakdown voltage of a diode would be 8 volts.

And as shown in FIG. 6, the breakdown voltage can be freely controlled by p-dose.

Figure 7:
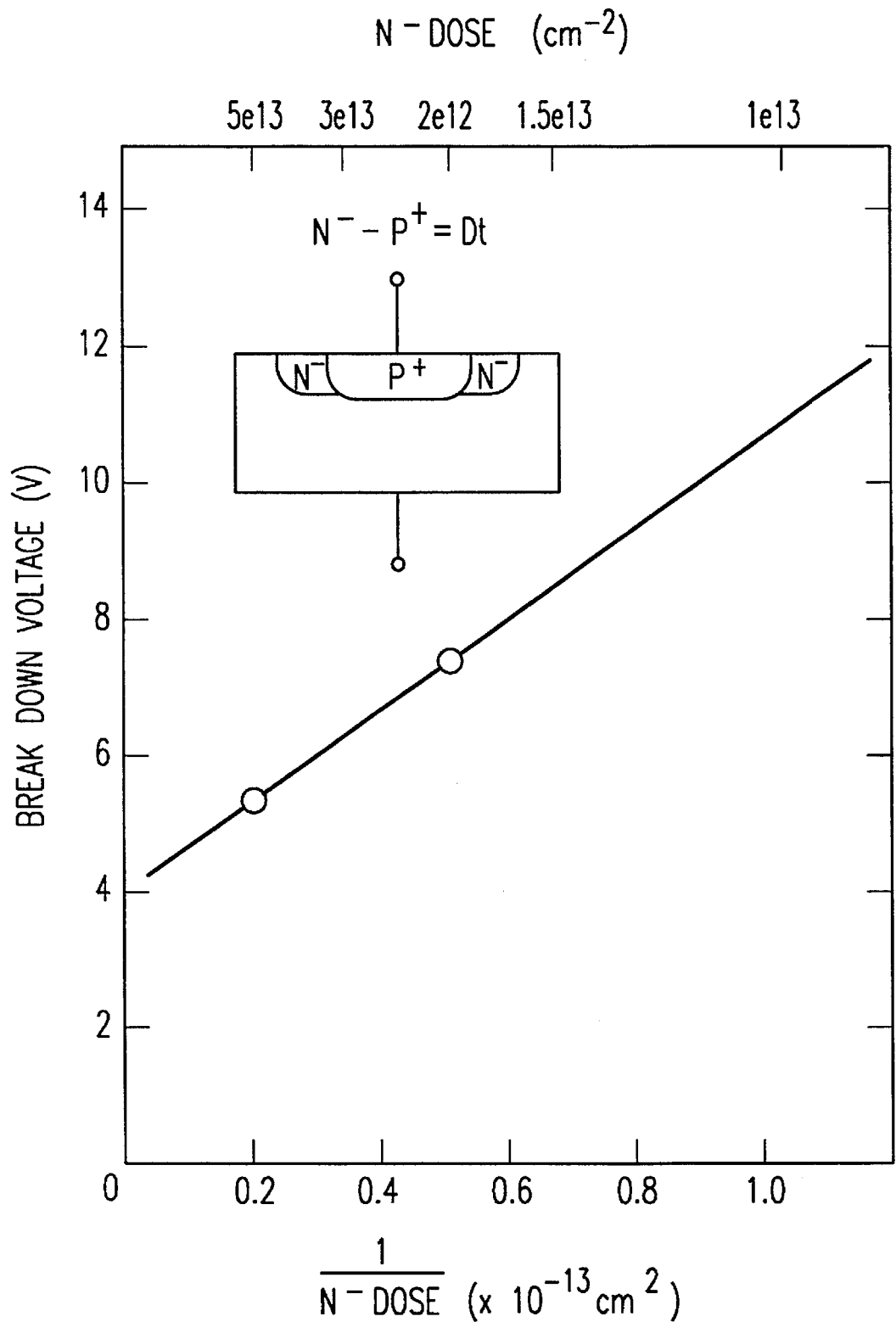

For another example, FIG. 7 shows the relationship between breakdown voltage of a diode that is comprised of a p-type high concentration diffusion layer and an n-type low concentration diffusion layer and n-dose for forming the n-type low concentration diffusion layer.

In this case, the breakdown voltage can be freely controlled by n-dose as well as in the case of FIG. 6.

Figure 8:
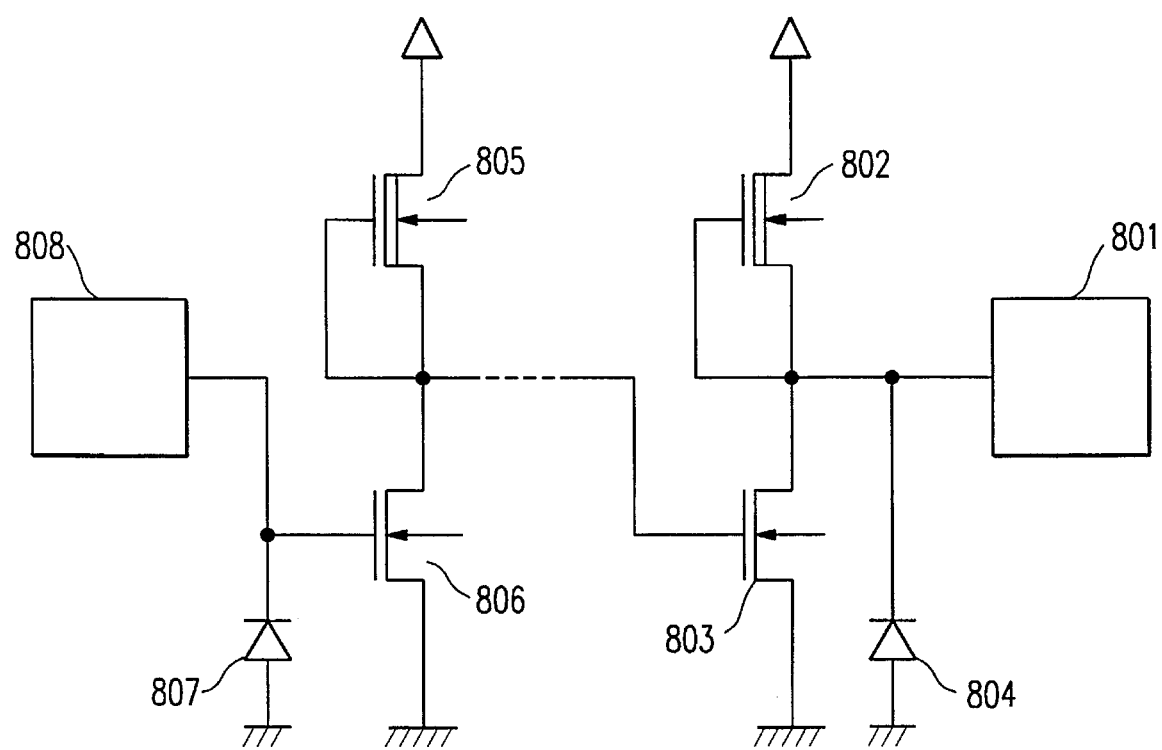
FIG. 8 is a circuit diagram using the third embodiment of this invention.

FIG. 8 shows a circuit utilizing the third embodiment of the invention. The circuit includes an output bonding pad 801, an input bonding pad 808 for external contact with the circuit. Depletion n-channel transistors 802 and 805 that are connected as loads and that form inverters along with n-channel transistors 803 and 806, respectively. Diodes 804 and 807 have a reduced breakdown voltage according to the invention. By using such diodes in the illustrated circuit, internal circuits can be protected from static electricity from the outside. While an n-channel transistor has been described, as a matter of course, a p-channel transistor may be employed as well.

Figure 9:
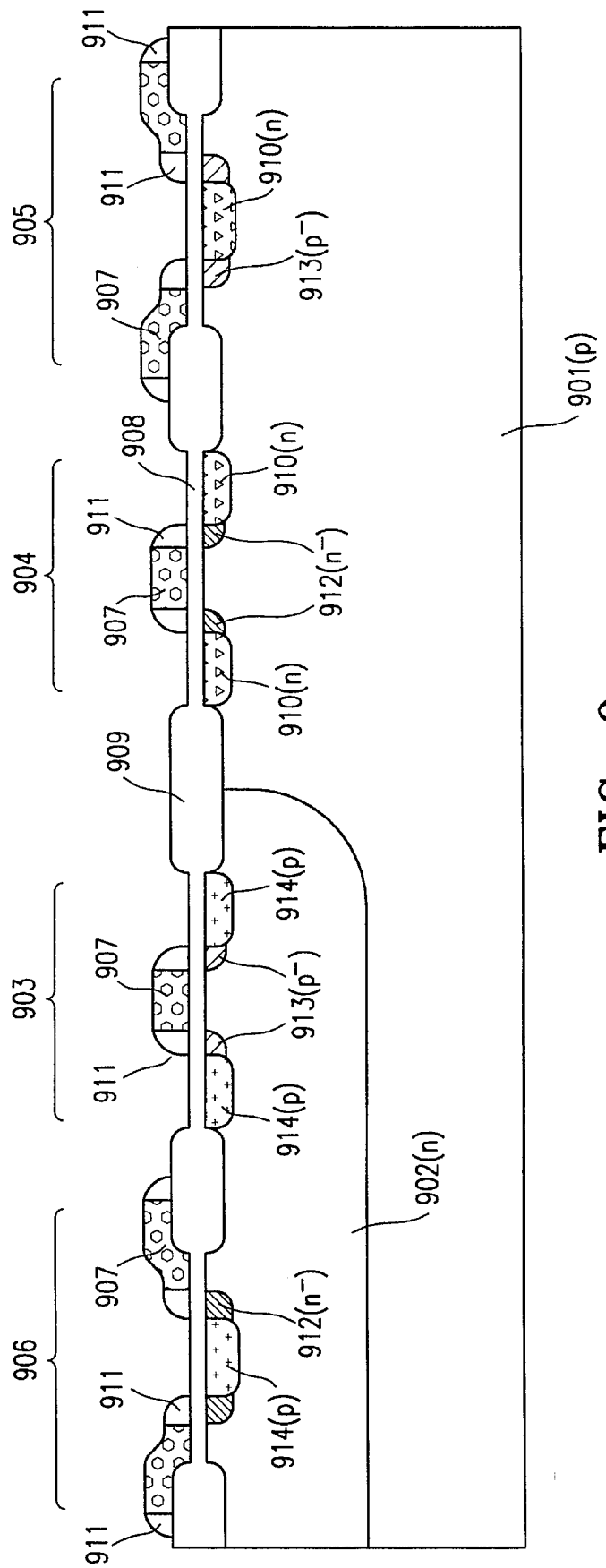
FIG. 9 shows a cross section of a fourth embodiment of this invention.

FIG. 9 is a cross section that shows the fourth embodiment of this invention. It is an example of applying the third embodiment to a CMOS structure and then reducing the number of production process steps.

The structure is fabricated in and on a p-type substrate 901 in which is formed an n-well 902. The structure includes a p-channel transistor 903 formed in the n-well, an n-channel transistor 904 formed in the p-type substrate, and n-p and p-n diodes 905 and 906 that were formed based on the principles of this invention. Diode 905 is in p-type material of substrate 901 and diode 906 is in n-well 902.

The circuit elements 903–906 are each provided with a gate insulating film 908, which, like in the previous embodiments, is an $SiO_2$ layer that is 10 nm thick. An oxide layer 909 is provided for isolating the circuit elements. Each circuit element has a gate electrode 907. N-channel transistor 904 has n-type diffusion regions 910 that are the source and drain of the n-channel transistor and that are formed at an impurity concentration of from $1E20cm^{-3}$ to $1E21cm^{-3}$.

Each gate electrode has side walls 911 formed, for example, of an oxide film, just as in the preceding embodiments. Transistor 904 also has n-type low impurity concentration diffusion regions 912, which will become the offset of the LDD structure in n-channel transistor 904 and which are formed to have an impurity concentration of from $1E17cm^{-3}$ to $5E19cm^{-3}$.

P-channel transistor 903 has p-type diffusion regions 914 which are the source and drain of the p-channel transistor and are formed to have an impurity concentration of from $1E20cm^{-3}$ to $1E21cm^{-3}$. Transistor 903 also has p-type low impurity concentration diffusion regions 913 which will become the offset of the p-channel transistor and which are formed to have an impurity concentration of from $1E17cm^{-3}$ to $5E19cm^{-3}$.

Diode 905 includes an n-type diffusion region 910, which is like region 505 of FIGS. 5(a) and (b), formed in the area enclosed by side wall 911, and a p-type low impurity concentration region 913, like region 506 of FIGS. 5(*a*) and (*b*), formed essentially below side wall 911. The impurity concentration in region 913 is higher than the impurity concentration in substrate 901.

Contrary to this, diode 906 includes a p-type diffusion region 914 formed in the area enclosed by side wall 911 and an n-type low impurity concentration diffusion region 912 formed essentially below side wall 911.

When considering the breakdown voltage of diodes 905 and 906, the diode breakdown voltage can be lowered because the n-type diffusion region 910 makes contact with the p-type low impurity concentration diffusion region 913. The breakdown voltage of diode 906 can be reduced in the same manner. When considering a specific breakdown voltage value, the breakdown voltage is about 7 volts due to the p-type low impurity concentration region 913 and the n-type low impurity concentration region 912 having an impurity concentration of $1E18cm^{-3}$.

The low impurity concentration diffusion regions 912 and 913 are formed by implanting phosphorous and boron, respectively, by ion implantation after forming the designated patterns. Therefore, the formation of low impurity concentration diffusion regions for reducing the breakdown voltage can take place by merely changing the photoresist pattern, and can be formed at the same time as the transistor offset. This means this can take place without increasing the number of production process steps.

In addition, FIG. 9 is directed to an example that uses transistors in which the n-channel and p-channel transistors have an LDD structure. However, when only transistors of one channel type have an LDD structure, for example in a case in which the n-channel transistors have an LDD structure and the p-channel transistors have a single drain structure, it is possible to reduce the breakdown voltage of the p-channel transistors by forming an n-type low impurity concentration diffusion region in the p-channel transistors.

Figure 10:
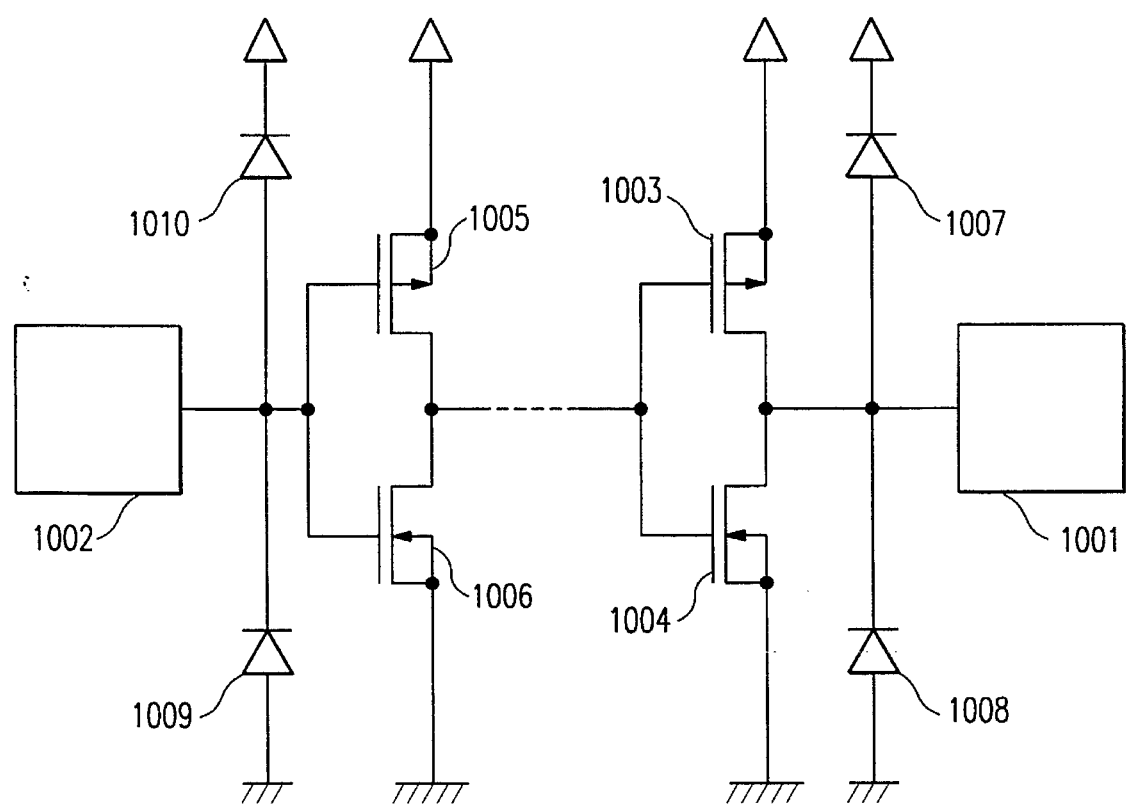
FIG. 10 is a circuit diagram using the fourth embodiment of this invention.

FIG. 10 is a circuit utilizing the third embodiment of the invention. The circuit includes an output bonding pad 1001, an input bonding pad 1002 for external contact with the circuit. P-channel transistors 1003 and 1005 are each paired, and form inverters with, respective ones of n-channel transistors 1004 and 1006. Diodes 1007 and 1010 are p-n diodes and diodes 1008 and 1009 are n-p diodes all formed to have a reduced breakdown voltage according to the invention. By using such diodes in the illustrated circuit, internal circuits can be protected from static electricity from the outside.

For example, when the impurity concentration of regions 912 and 913 are each set to $1E18cm^{-3}$ the transistor breakdown voltage is about 7 volts, which is sufficiently below the 10-volt gate insulating film breakdown voltage. Therefore, even if static electricity enters a semiconductor device, the diode will break and the transistors will be adequately protected. In addition, low breakdown voltage diodes are formed on both the grounding side and the power supply side to be effective against both positive and negative static electricity.

The fourth embodiment of the invention can be implemented by other methods. A method that forms a low breakdown voltage diode without using the end of the gate has been disclosed in Japanese laid-open application number Hei 1-166562. However, the fifth embodiment of this invention, to be described below, is an example that employs a low breakdown voltage diode that is formed without using the end of a gate of a CMOS and which does not increase the number of production process steps.

Figure 11:
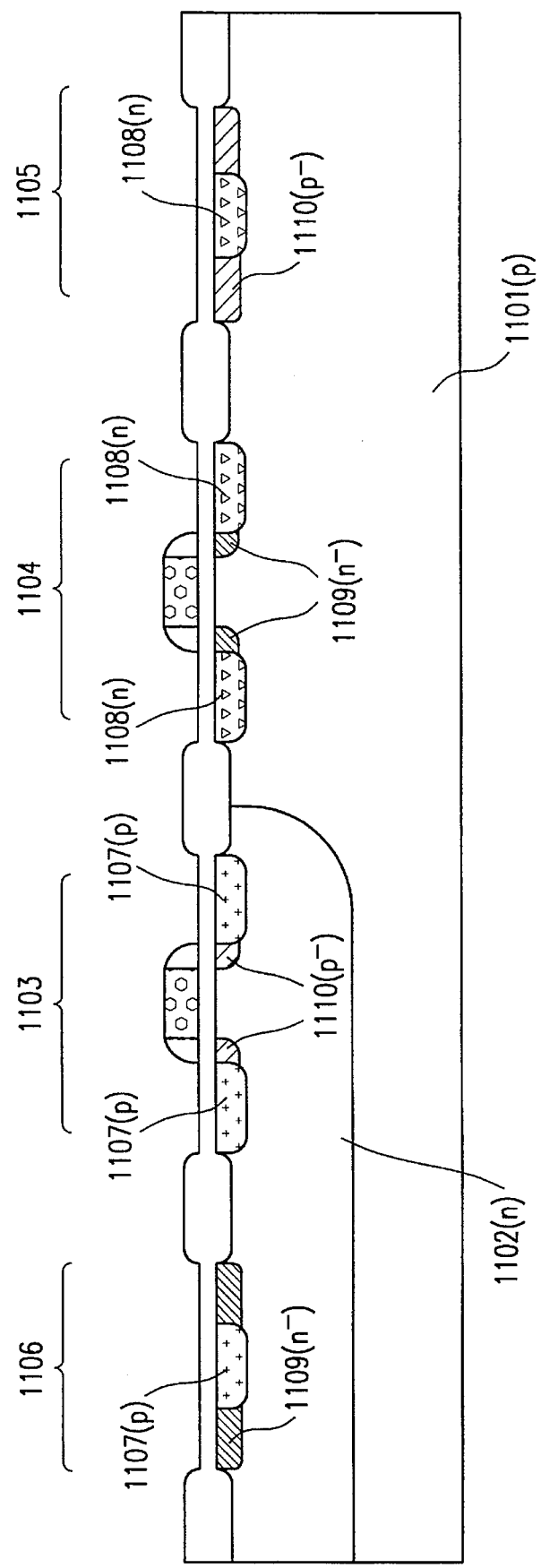
FIG. 11 shows a cross section of a fifth embodiment of this invention.

A cross section of the fifth embodiment is shown in FIG. 11. A p-type substrate 1101 is provided with an n-well 1102, a p-channel transistor 1103 formed in the n-well 1102, an n-channel transistor 1104 formed in the p-type substrate 1101, an n–p diode 1105 formed in substrate 1101 and a p-n diode 1106 formed in n-well 1102, the diodes being formed in accordance with the invention.

N-type diffusion regions 1108 that will become the source and drain of n-channel transistor 1104 are formed at an impurity concentration of from $1E20cm^{-3}$ to $1E21cm^{-3}$.

N-type low impurity concentration diffusion regions 1109, which will become the LDD structure offset in the case of an n-channel transistor such as transistor 1104. Regions 1109 are formed to have an impurity concentration of from $1E17cm^{-3}$ to $5E19cm^{-3}$. At the same time, the n-type low impurity concentration diffusion regions 1109 are formed as part of p-n diodes, such as 1106, so that it will also make contact with a p-type diffusion region 1107. Other p-type diffusion regions 1107 form the source and drain of p-channel transistor 1103. Regions 1107 have an impurity concentration of $1E20cm^{-3}$ to $1E21cm^{-3}$. P-type low impurity concentration diffusion regions 1110 form the offset of p-channel transistor 1103 and are formed to have an impurity concentration of from $1E17cm^{-3}$ to $5E19cm^{-3}$. At the same time, a p-type low impurity concentration diffusion region 1110 is formed within the n–p diode 1105 so that it makes contact with an n-type diffusion region 1108. By having a structure such as this, a low breakdown voltage diode can be created without an increase in the number of production process steps.

Comparing the fifth embodiment with the third and fourth embodiments, in the third and fourth embodiments, the formation of a low impurity concentration diffusion region is possible in a self-alignment manner by use of the gate electrode as a mask. Accordingly, the density of the circuit elements improves and properties such as breakdown voltage can be better stabilized.

Figure 12A:
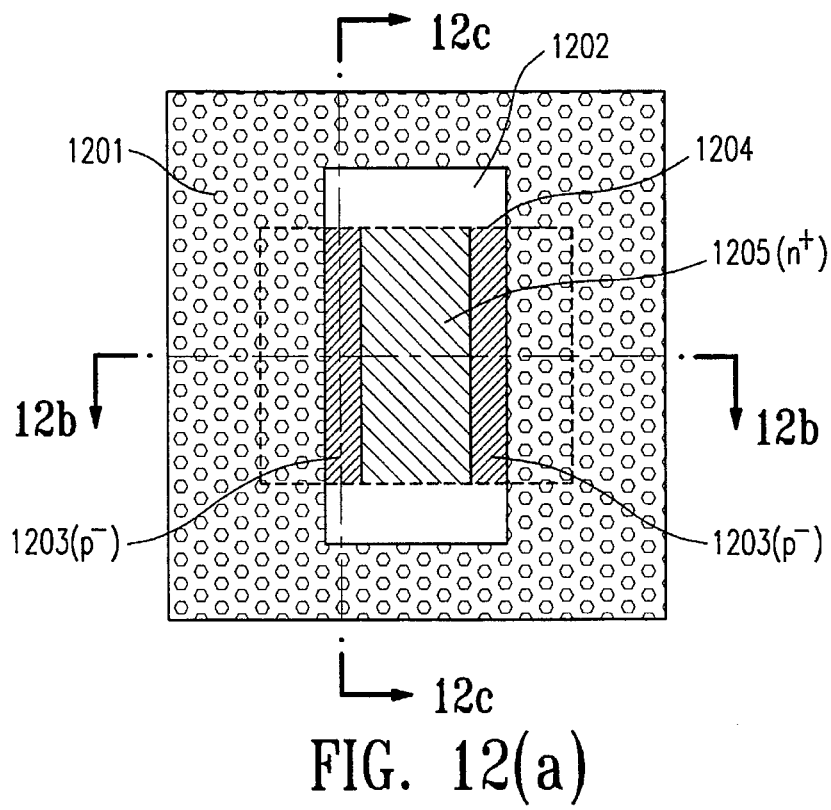
FIG. 12(a) shows a top view of a sixth embodiment of this invention.
Figure 12B:
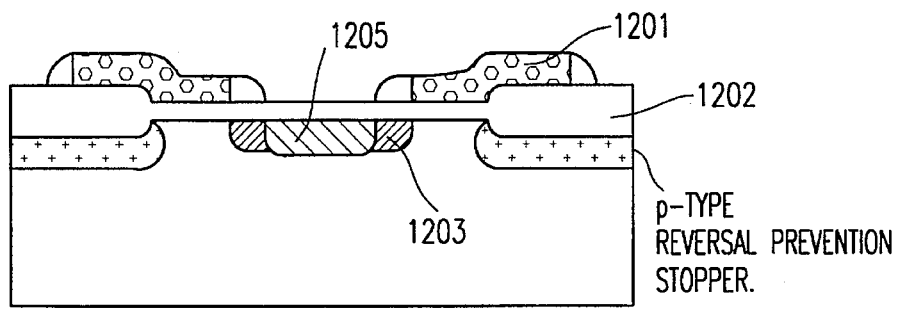
FIGS. 12(b) and 12(c) are cross-sectional views taken along lines 12b—12b and 12c—12c respectively, of FIG. 12(a).
Figure 12C:
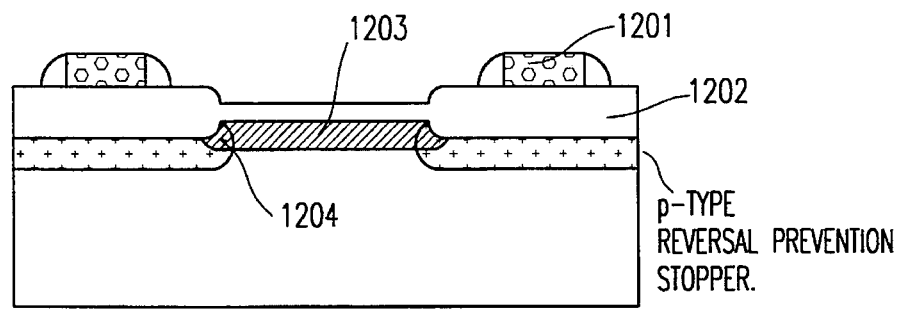

The sixth embodiment of this invention is one that further promotes the lowering of breakdown voltage of the third embodiment. For the purpose of description, an n–p diode will be used. FIG. 12(*a*) shows a top view of the sixth embodiment of this invention, and FIGS. 12(*b*) and 12(*c*) show cross-sectional views taken along lines 12*b*—12*b* and 12*c*—12*c*, respectively, of FIG. 12(*a*). In the third embodiment in FIG. 5, gate electrode 503 was formed so that it covered the entire circuit element isolation region, and the p-type low impurity concentration diffusion region 506 was formed all around the diode and made contact with n-type diffusion region 505 around the entire periphery.

In contrast to this, in the case of the sixth embodiment in FIGS. 12(*a*), 12(*b*) and 12(*c*), gate electrode 1201 is formed to leave exposed portions of circuit element isolation region 1202. As a consequence, p-type low impurity concentration diffusion regions 1203 are formed only on two parts of the diode. An n-type high impurity concentration diffusion region 1205 forms the other region of the diode junction. At boundaries, or interfaces, 1204 between circuit element isolation regions 1202 and p-type low impurity concentration diffusion regions 1203, a p-type reversal prevention stopper that is formed at the bottom of the circuit element isolation regions intersects with the p-type low impurity concentration diffusion regions 1203, resulting in a further increase in the p-type impurity concentration and allowing a further decrease in the breakdown voltage of the diode.

For example, when $1E18cm^{-3}$ is the impurity concentration of p-type low impurity concentration layer 1203 and the p-type reversal prevention stopper is formed with an impurity concentration of $5E17cm^{-3}$, the diode breakdown voltage is about 6.2 volts, allowing a lower breakdown voltage than the approximately 7 volts of the third embodiment.

The seventh embodiment of this invention applies CMOS to the sixth embodiment of this invention. The cross sectional structure is the same as in FIG. 9. However, as in FIGS. 12(a), 12(b) and 12(c), in the case of the flat region of the low breakdown voltage diode, a portion of the gate electrode is formed so that the circuit element isolation region is exposed, and there is an intersection point between the circuit element isolation region and the low impurity concentration diffusion region. In addition, as in the fourth embodiment, the low impurity concentration diffusion region, which is formed on the diode region, is also used as the offset of the LDD transistor. By having a structure such as this one, a lower breakdown voltage diode than that in the fourth embodiment can be created with absolutely no increase in the number of production process steps.

In the second, fourth and sixth embodiments described above, two types of diodes have been fabricated, n-p diodes and p-n diodes. However, it goes without saying that in a CMOS structure in which the n-channel has an LDD structure and the p-channel has a single drain structure, it is appropriate to form only a p-n diode in which the n-type low impurity concentration diffusion region that becomes the n-channel offset makes contact with the p-type diffusion region that forms the drain of the p-channel transistor.

Figure 13A:
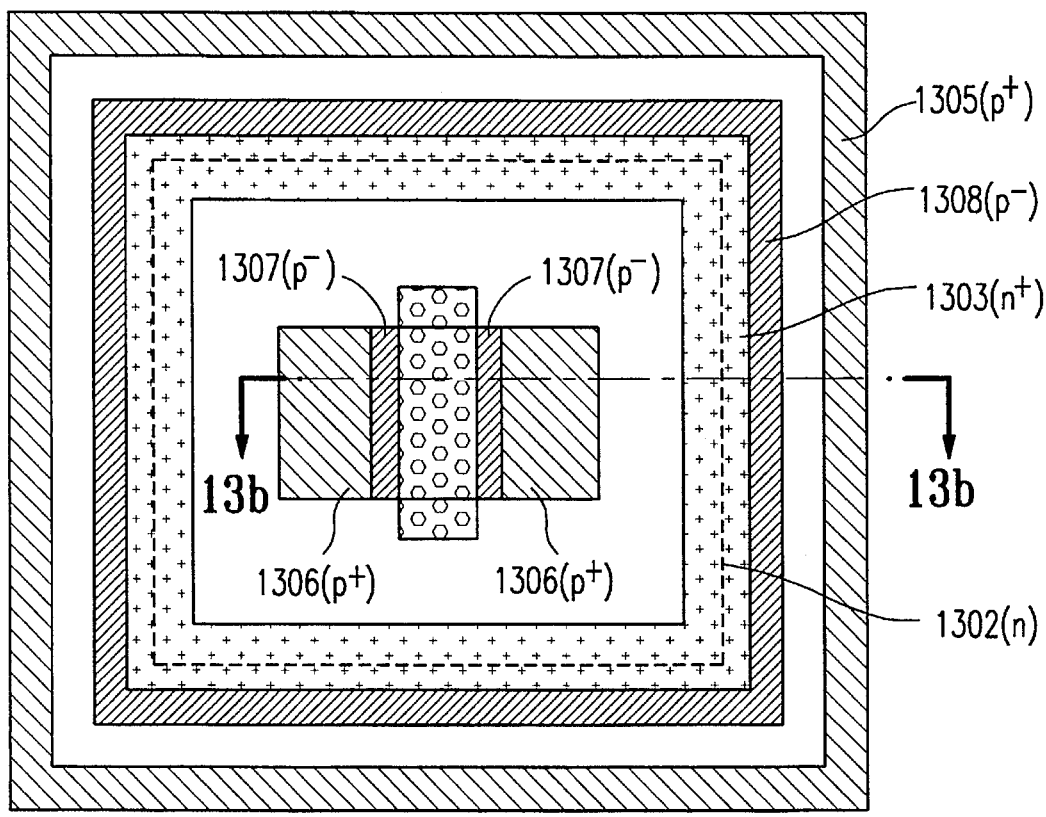
FIGS. 13(a) and (b) show a top view and a cross section of an eighth embodiment of this invention.
Figure 13B:
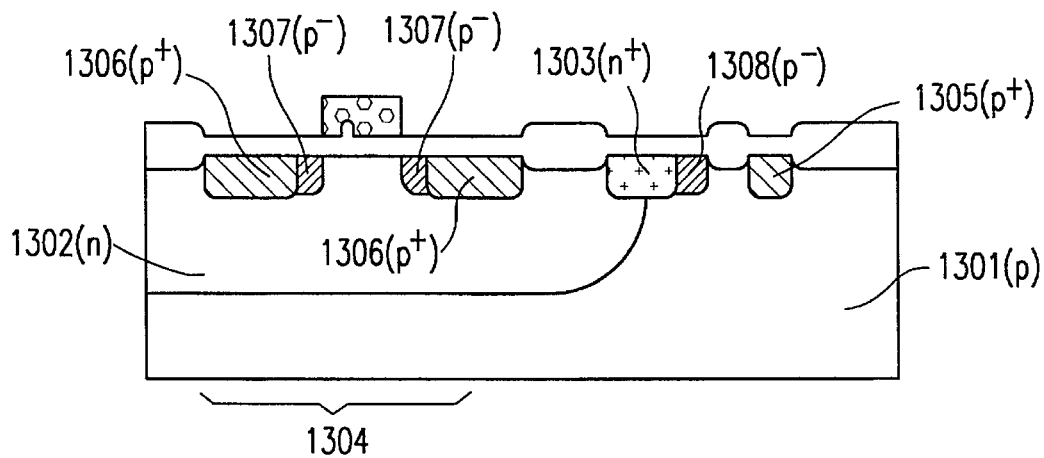

The eighth embodiment of this invention is an example in which the fifth embodiment is formed as a diode that is formed between power supplies. FIG. 13(a) shows a top view of the eighth embodiment of this invention. FIG. 13(b) shows a cross section along line 13b—13b of FIG. 13(a). Here, a description will be given of an example in which a p-type substrate 1301 is used. However, of course, an n-type substrate may also be used.

P-type substrate 1301 is, for example, a 10-ohm-cm substrate in which an n-well 1302 is formed. P-channel transistor 1304 is formed in n-well 1302. A comparable n-channel transistor (not illustrated) is formed in p-type substrate 1301. Around the periphery of n-well 1302, an n-type high impurity concentration diffusion region 1303, which has an impurity concentration of $1E20cm^{-3}$ or higher, is formed as the n-type diffusion region for obtaining the n-well electrical potential, VDD. Region 1303 straddles the boundary of n-well 1302. Normally, identical diffusion regions are fabricated simultaneously to form the source and drain of the n-channel transistor. However, they may also be fabricated separately.

P-type high impurity concentration diffusion region 1305 is formed so that it has an impurity concentration of $1E20cm^{-3}$ or higher as the p-type diffusion region for obtaining the p-type substrate electrical potential, VSS, and it is formed opposite to the n-type high impurity concentration diffusion region 1303. P-type diffusion region 1305 normally is formed at the same time, and with the same impurity concentration, as p-type diffusion regions 1306 which form the source and drain of p-channel transistor 1304.

P-channel transistor 1304 has an LDD structure and is formed so that low impurity concentration diffusion region 1307 has an impurity concentration of from $1E17cm^{-3}$ to $5E19cm^{-3}$.

This embodiment is one that uses the low breakdown voltage diode of the fifth embodiment between the VDD and VSS power supplies, and region 1308 has the same p-type low impurity concentration as regions 1307. Because region 1308 is formed at the same time as regions 1307, it is possible to form a low breakdown voltage diode, 1303, 1308, between the power supplies without adding additional production process steps. In addition, even when static electricity enters between the power supplies, it is possible to protect against the static electricity through this low breakdown voltage diode so that transistors fabricated on the inside of the circuit will be protected. By fabricating the low breakdown voltage diode between the power supplies, it is possible to fabricate a semiconductor device with a large surface area and a large static electricity resistance.

Figure 14:
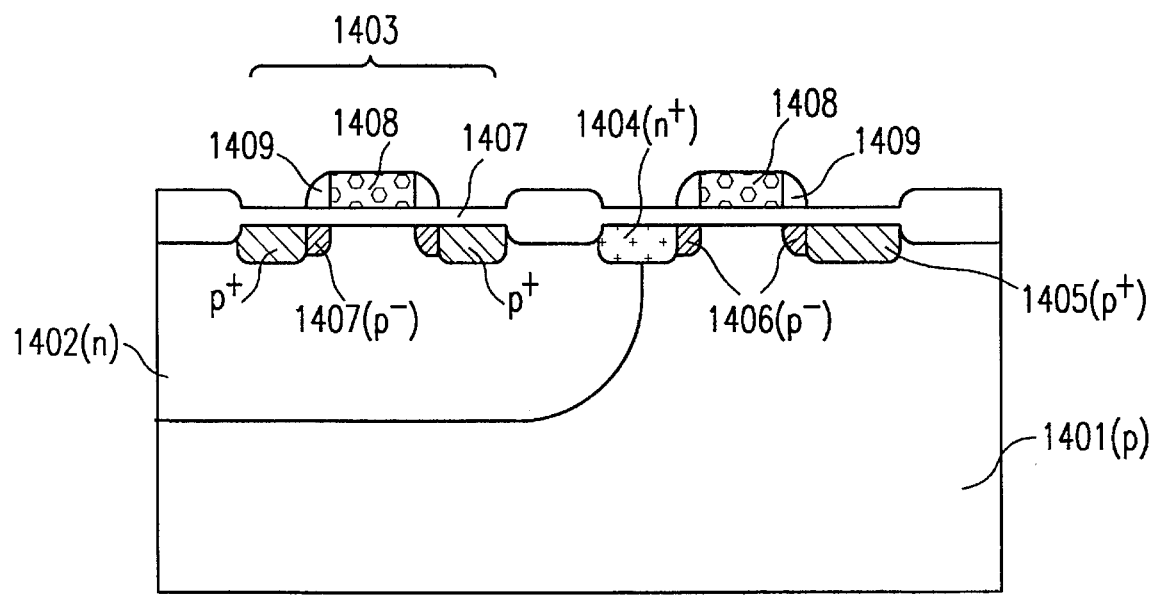
FIG. 14 shows a cross section of a ninth embodiment of this invention.

The ninth embodiment of this invention is the fourth embodiment applied to a diode formed between the power supplies. FIG. 14 shows a cross section of the ninth embodiment of this invention in which an n-well 1402 is formed within p-substrate 1401. A P-channel transistor 1403 is formed within n-well 1402 and an n-type high impurity concentration diffusion region 1404 is formed in substrate 1401 and partly in n-well 1402 so as to straddle the boundary of n-well 1402 in order to provide the electrical potential of the n-well, just as in the eighth embodiment. P-type high impurity concentration diffusion region 1405 is provided in p-substrate 1401 for providing or obtaining the electrical potential of the p-type substrate. FIG. 14 illustrates only a single transistor, 1403. The regions in the p-type portion of substrate 1401 and the electrode 1408 on that portion serve as potential supply points.

As in the eighth embodiment, in order to give the diode between the power supply potentials a low breakdown voltage, p-type low impurity concentration diffusion regions 1406 are fabricated such that one region 1406 makes contact with region 1404, and p-type low impurity concentration diffusion regions 1406 are of the same composition as, and can be formed simultaneously with, diffusion regions 1407 of the p-channel transistor 1403 which has an LDD structure. In this embodiment, regions 1406 and 1407 are formed in a self-alignment manner beneath side walls 1409, which are formed on the sides of gate electrodes 1408 after formation of regions 1406 and 1407.

In contrast to the eighth embodiment, the ninth embodiment allows a reduction in the width of region 1406 because p-type low impurity concentration diffusion region 1406 can be formed in a self-alignment manner with the aid of the gate electrode. This promotes stabilization of the breakdown voltage and miniaturization of the device.

Figure 15:
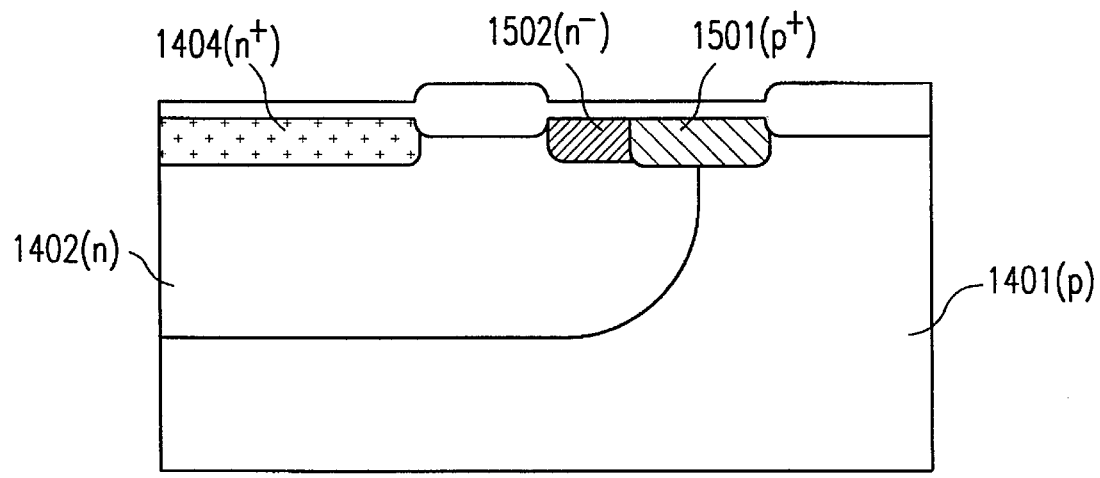
FIG. 15 shows a cross section that is a variation of the eighth and ninth embodiments of this invention.

In the eighth and ninth embodiments, the diodes fabricated between the power supplies potentials are fabricated throughout the entire well region. However, it is not necessary to fabricate them throughout this entire region. They may be fabricated only on a portion of the well region. In addition, in the eighth and ninth embodiments, the n-type high impurity concentration diffusion region and the p-type low impurity concentration diffusion region that is used for the p-channel offset are fabricated so that they make contact with one another. However, in FIG. 15 a p-type high impurity concentration diffusion region 1501 and an n-type low impurity concentration diffusion region 1502 which is used for the n-channel offset, may be allowed to make contact.

Figure 16A:
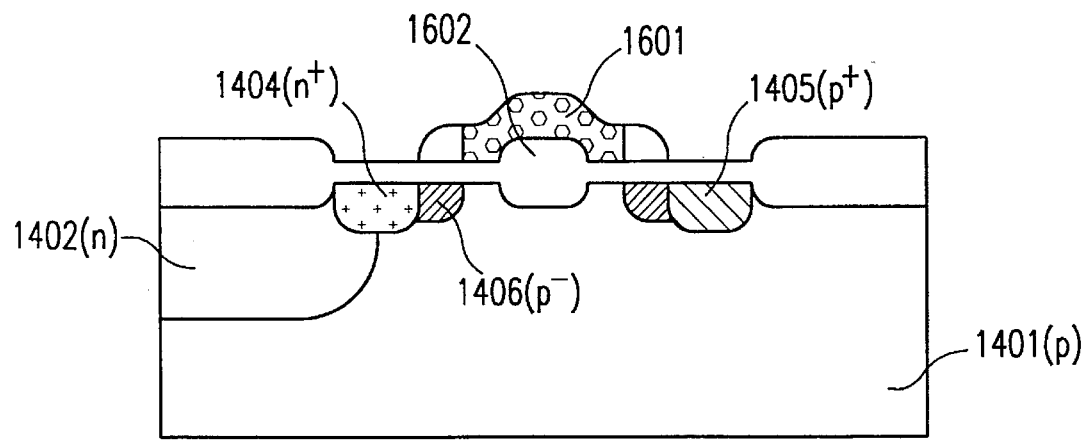
FIGS. 16(a) and (b) show cross sections that are variations of the ninth embodiment of this invention.

In addition, in the ninth embodiment, the diode between the power supplies may be fabricated such that gate electrode 1601 covers circuit element isolation region 1602, as shown in FIG. 16(a). The intent of this invention will not be obstructed in the least by fabricating a portion of gate electrode 1603 on top of circuit element isolation region

Figure 16B:
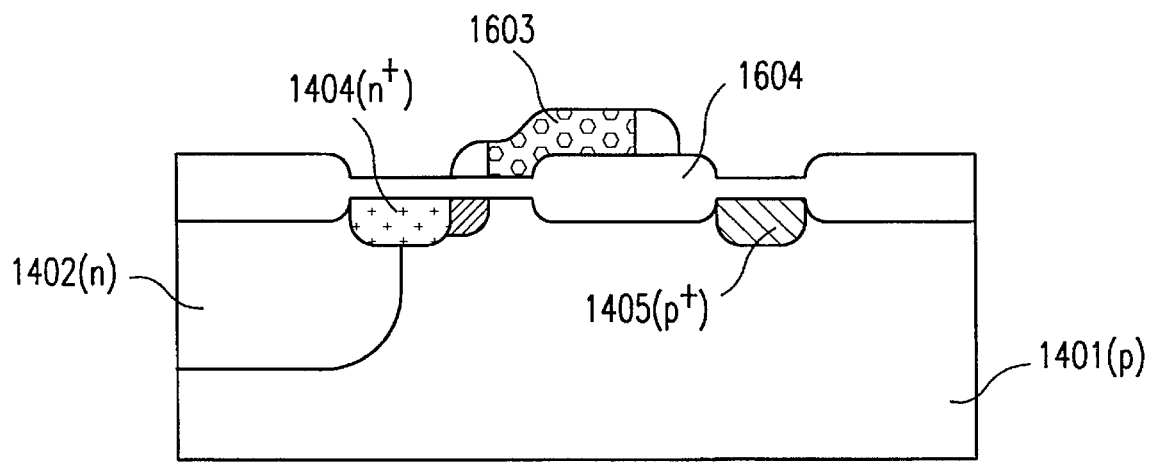

1604 as shown in FIG. 16(*b*). Otherwise, the circuits of FIGS. 16(*a*) and (*b*) may be identical to that of FIG. 14.

As described above, by fabricating the transistors and diodes formed inside of protection circuitry and inside of semiconductor devices or by fabricating diodes formed between power supplies of a high impurity concentration diffusion region and a low impurity concentration diffusion region which has the opposite conductivity to the high impurity concentration diffusion region and is formed such that it makes contact with the high impurity concentration diffusion region, and by forming the low breakdown voltage circuit element in the semiconductor device, it is possible to fabricate low breakdown voltage circuit elements within the semiconductor device, thereby creating a semiconductor device that can be protected from surge inputs from the outside, such as static electricity.

In addition, in a semiconductor device with a CMOS structure, by using the opposite conductivity low impurity concentration diffusion region and by using the same diffusion region composition as the low impurity concentration diffusion region of the LDD structure transistor, low breakdown voltage circuit elements can be fabricated within the semiconductor device without increasing the number of production process steps.

This application relates to subject matter disclosed in Japanese Application number 93/1072, filed on Jan. 7, 1993, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. A semiconductor device comprising a semiconductor substrate having a surface and containing at least one MOS transistor having a source region and a drain region constituted by respective impurity diffusion regions in the substrate, and a channel region extending in a first direction parallel to said substrate surface between said source region and said drain region, wherein at least said drain region of said MOS transistor comprises a first impurity diffusion region containing an impurity of a first conductivity type in a high concentration, and a second impurity diffusion region between said first impurity diffusion region and said channel region, said second impurity diffusion region having a first portion containing an impurity of the first conductivity type in a low concentration, and a second portion which has a second conductivity type that is opposite to the first conductivity type, both said first and second portions are in contact with parts of said semiconductor substrate which underlie said second impurity diffusion region, and said first and second portions are offset from one another in a direction parallel to said substrate surface and perpendicular to said first direction, and further wherein said transistor has a breakdown voltage and said second portion contacts said first impurity diffusion region to determine said breakdown voltage.

2. A semiconductor device comprising a semiconductor substrate having a surface and containing a first MOS transistor of a first conductivity type and a second MOS transistor of a second conductivity type opposite to the first conductivity type, each said transistor having a source region and a drain region constituted by respective impurity diffusion regions in the substrate, and a channel region extending in a first direction parallel to said substrate surface between said source region and said drain region, wherein at least the drain region of said first MOS transistor comprises a first impurity diffusion region containing an impurity of the first conductivity type in a high concentration, and a second impurity diffusion region between said first impurity diffusion region and said channel region, said second impurity diffusion region having a first portion containing an impurity of the first conductivity type in a low concentration, and a second portion which has the second conductivity type, said drain region of said second transistor has a portion having the same composition as said first portion of second impurity diffusion region, add said first and second portions are offset from one another in a direction parallel to said substrate surface and perpendicular to said first direction, and further wherein said first transistor has a breakdown voltage and said second portion of said second impurity diffusion region contacts said first impurity diffusion region to determine said breakdown voltage.

3. A semiconductor device comprising a semiconductor substrate containing an impurity of a first conductivity type in a first concentration and containing a MOS transistor of a second conductivity type opposite to the first conductivity type and a diode, said diode comprising: a gate electrode on said substrate; a side wall spacer of insulating material contacting said gate electrode; a first impurity diffusion region containing an impurity of the second conductivity type, said first region having an edge and being formed so that at least a first portion of said edge self aligns with an edge of said side wall spacer; and a second impurity diffusion region containing an impurity of the first impurity type in a second concentration which is higher than the first concentration, said second region being in contact with said first region and having an edge which self aligns with an edge of said gate electrode.

4. A semiconductor device as defined in claim 3 wherein: said device further comprises an insulating layer portion formed on the surface of said substrate and constituting a circuit element isolating region; and a second portion of said edge of said first region self aligns to said circuit element isolating region.

5. A semiconductor device comprising a semiconductor substrate having a semiconductor region, said substrate containing a first MOS transistor of a first conductivity type and a second MOS transistor of a second conductivity type, the second conductivity type being opposite to the first conductivity type, each MOS transistor having a source region and a drain region constituted by respective impurity diffusion regions, wherein: said drain region of said first MOS transistor comprises a first impurity diffusion region containing an impurity of the first conductivity type in a high concentration and a second impurity diffusion region containing an impurity of the first conductivity type in a low concentration; said second MOS transistor is formed in said semiconductor region; and said device further comprises a diode formed in said semiconductor region, said diode comprising: a gate electrode on said substrate; a side wall spacer of insulating material contacting said gate electrode; a third impurity diffusion region containing an impurity of the second conductivity type, said third region having an edge and being formed so that at least a first portion of said edge self aligns with an edge of said side wall spacer; and a fourth impurity diffusion region containing an impurity of the first conductivity type in a low concentration and contacting said third region, said fourth impurity diffusion region having an edge which self aligns with an edge of said gate electrode.

6. A semiconductor device as defined in claim 5 wherein: said device further comprises an insulating layer portion formed on the surface of said substrate and constituting a circuit element isolating region; and a second portion of said edge of said third region self aligns to said circuit element isolating region.

7. A semiconductor device comprising a semiconductor substrate having a semiconductor region, said semiconductor region having a boundary, said substrate containing at least one MOS transistor of a first conductivity type and at least one MOS transistor of a second conductivity type, the second conductivity type being opposite to the first conductivity type, each MOS transistor having a source region and a drain region constituted by respective impurity diffusion regions, wherein: said drain region of said MOS transistor of the first conductivity type comprises a first impurity diffusion region containing an impurity of the first conductivity type in a high concentration and a second impurity diffusion region containing an impurity of the first conductivity type in a low concentration; and said device further comprises: an insulating layer portion formed on the surface of said substrate and constituting a circuit element isolating region; a third impurity diffusion region containing an impurity of the first conductivity type in a high concentration and a fourth impurity diffusion region straddling said boundary of said semiconductor region and containing an impurity of the second conductivity type, said third and fourth regions being on opposite sides of said circuit element isolating region; and a fifth impurity diffusion region containing an impurity of the first conductivity type in a low concentration contacting said fourth impurity diffusion region so that said fourth and fifth regions form a diode.

8. A semiconductor device comprising a semiconductor substrate of a first conductivity type, said substrate having a semiconductor region of a second conductivity type opposite to the first conductivity type, said semiconductor region having a boundary, said substrate containing at least one MOS transistor of the first conductivity type, said at least one MOS transistor having a source region and a drain region constituted by respective impurity diffusion regions, and a channel region between said source region and said drain region, wherein: said drain region of said MOS transistor of the first conductivity type comprises a first impurity diffusion region containing an impurity of the first conductivity type in a high concentration and a second impurity diffusion region containing an impurity of the first conductivity type in a low concentration; said device further comprises: a gate electrode on said substrates; a side wall spacer of insulating material contacting said gate electrode; a third impurity diffusion region containing an impurity of the first conductivity type, said third region having an edge and being formed so that at least a portion of said edge self aligns with an edge of said side wall spacer, and a fourth impurity diffusion region straddling said boundary of said semiconductor region and containing an impurity of the second conductivity type in a high concentration, with said gate electrode being located between said third and fourth regions; and a fifth impurity diffusion region containing an impurity of the first conductivity type in a low concentration contacting said fourth impurity diffusion region so that said fourth and fifth regions form a diode.

* * * * *